United States Patent
Sidelnicov et al.

(10) Patent No.: US 9,905,707 B1
(45) Date of Patent: Feb. 27, 2018

(54) MOS CAPACITIVE STRUCTURE OF REDUCED CAPACITANCE VARIABILITY

(71) Applicant: GLOBALFOUNDRIES Inc., Grand Cayman (KY)

(72) Inventors: Andrei Sidelnicov, Dresden (DE); Alban Zaka, Dresden (DE); El Mehdi Bazizi, Dresden (DE); Venkata Naga Ranjith Kumar Nelluri, Dresden (DE); Juergen Faul, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/337,026

(22) Filed: Oct. 28, 2016

(51) Int. Cl.
*H01L 29/00* (2006.01)
*H01L 29/94* (2006.01)
*H01L 29/66* (2006.01)
*H01L 21/265* (2006.01)

(52) U.S. Cl.
CPC ............ *H01L 29/94* (2013.01); *H01L 21/265* (2013.01); *H01L 29/66174* (2013.01)

(58) Field of Classification Search
CPC ..... H01L 2924/00; H01L 28/40; H01L 28/60; H01L 23/5223; H01L 27/0805; H01L 23/642; H01L 27/10852; H01L 2924/19041; H01L 29/94
USPC ........................................................ 257/532
See application file for complete search history.

(56) References Cited

U.S. PATENT DOCUMENTS

| | | | | |
|---|---|---|---|---|
| 2003/0008467 A1* | 1/2003 | Kai | ................... | H01L 21/31122 438/393 |
| 2003/0092239 A1* | 5/2003 | Coolbaugh | ............. | H01L 28/40 438/396 |
| 2003/0218213 A1* | 11/2003 | Ipposhi | ............. | H01L 21/76283 257/350 |

* cited by examiner

*Primary Examiner* — Theresa T Doan
(74) *Attorney, Agent, or Firm* — Amerson Law Firm, PLLC (57) ABSTRACT

Capacitive structures in the device level of sophisticated MOS devices may be formed so as to exhibit a significantly reduced capacitance/voltage variability. To this end, a highly doped semiconductor region may be formed in the "channel" of the capacitive structure. For example, for a specified concentration of the dopant species and a specified range of the vertical dimension of the highly doped semiconductor region, a reduced variability of approximately 3% or less may be obtained for a voltage range of, for example, ±5 V.

19 Claims, 5 Drawing Sheets

MOS CAPACITIVE STRUCTURE OF REDUCED CAPACITANCE VARIABILITY

BACKGROUND OF THE INVENTION

1. Field of the Invention

Generally, the present disclosure relates to semiconductor devices, such as integrated circuit products, in which, in addition to active circuit elements, such as transistors and the like, passive circuit elements, and in particular capacitors, are also formed on the product.

2. Description of the Related Art

Continuous progress has been made in the semiconductor industry, thereby now providing integrated circuits having incorporated therein a very large number of circuit elements, such as transistors and the like. In addition to the transistor elements, which are typically provided in the form of digital switches and/or analog components for controlling voltage and/or currents within the semiconductor device, there is an ongoing development to integrate additional functionality into a single semiconductor device, thereby forming even complete systems on a single chip (SoC). Consequently, passive circuit elements, such as inductors, capacitors and the like, have to be implemented in an increasing number of integrated circuits in addition to the typically used resistors and capacitors for decoupling and information storage purposes.

For example, many manufacturing strategies have been developed for incorporating capacitive structures into the design of complex integrated circuits, for instance serving as decoupling capacitors, intended for stabilizing, for instance, the operating voltage, in particular in critical device areas, in which fast switching transistor elements may cause moderately high transient currents. To this end, semiconductor-based capacitor structures, for instance having one electrode in the active semiconductor material, may be provided at strategically appropriate locations in the semiconductor device so as to reduce supply voltage fluctuations. In other cases, a plurality of capacitors has to be incorporated in order to realize storage areas, such as dynamic RAM areas. In these storage areas, a bit of information is typically stored by using one capacitor and an associated transistor, wherein, in view of achieving a high bit density, the capacitors may typically be provided as deep trench capacitors, which, however, may require additional complex process steps for forming a deep trench and appropriately filling the trench with the conductive and dielectric materials.

When forming capacitive structures in the "device" level of a semiconductor device, i.e., in and on the semiconductor material, which is also used for forming the active circuit elements, such as sophisticated transistors for logic areas in silicon-based integrated circuits relying, for instance, on the well-established CMOS technique, these structures are preferably implemented as NMOS capacitors due to their superior characteristics, for instance with respect to capacitance/area ratio, frequency response for moderately high frequencies and the like. As a consequence, NMOS capacitors in CMOS integrated circuits have become widely adopted device architecture and therefore these NMOS capacitors represent a so-called "standard" capacitor type at the device level. For this reason, many appropriate process strategies have been developed and are available for forming such NMOS capacitors along with transistors in the device level.

In recent developments of semiconductor production, not only the critical dimensions of circuit elements, such as the gate length of transistors and the like, have been continuously shrunk, thereby presently arriving at a gate length of 30 nm and significantly less for planar transistor configurations, but also reduced power consumption and increased functionality have been addressed. For example, with respect to the formation of time-critical signal paths in an integrated circuit, complex gate electrode structures based on high-k dielectric materials in combination with metal-containing electrode materials may frequently be used, thereby reducing, among other things, static gate leakage, while still providing for a very low oxide equivalent thickness of the gate dielectric, which is necessary for proper static gate control. In less time-critical circuit areas, typically transistor elements with increased thickness of the gate dielectric material in combination with moderately high supply voltages are used in the device design.

In addition to the general quest for reducing overall power consumption while still maintaining high performance of integrated circuits, there is also an increasing demand for implementing passive circuit areas of increased functionality, for instance by incorporating RF components, which in turn may impart superior connectivity functionality to an integrated circuit. Therefore, increasingly, inductive and capacitive structures are incorporated into the design of integrated circuits, wherein certain requirements are to be met, in particular by the capacitors, with respect to functionality, stability and the like. For instance, in many applications, a capacitor is required to allow operation on the basis of a voltage with alternate polarity, thereby imposing certain constraints on the overall design of the capacitive structure. For example, it is well known that, for a capacitor, such as an NMOS capacitor, formed in the active semiconductor material, for instance by using appropriately dimensioned and composed "gate electrode structures" including a gate dielectric material as a capacitor dielectric, the resulting capacitance will depend, on the one hand, on the capacitance determined by the distance between the capacitor "plates." Here, the gate electrode material is one electrode of the capacitor and the semiconductor material acts as the second capacitor electrode, wherein these electrodes are separated by the gate dielectric material, which therefore defines, at a first glance, the distance of the electrodes. Moreover, the dielectric characteristics of the dielectric material are a further factor determining the capacitance. Despite these structurally determined influences, the capacitance will, on the other hand, significantly vary with the voltage applied to the "gate" electrode structure. That is, similarly to the typical transistor functionality, the gate voltage controls the charge carrier distribution in the capacitor body, which is basically a transistor body with appropriately selected lateral dimensions, and therefore the effective capacitance of the capacitor is significantly affected by the gate voltage.

As discussed above, there is an increasing demand for capacitors in semiconductor devices, which have to provide a substantially constant capacitance over a certain range of voltages applied to the capacitor. For example, implementing a more or less complete system on a single chip with RF functionality may require capacitors that have to operate at varying voltages or even at voltages of alternate polarity, which renders a capacitive structure based on conventional MOS transistor architectures less than desirable for the following reasons.

Figure 1A:
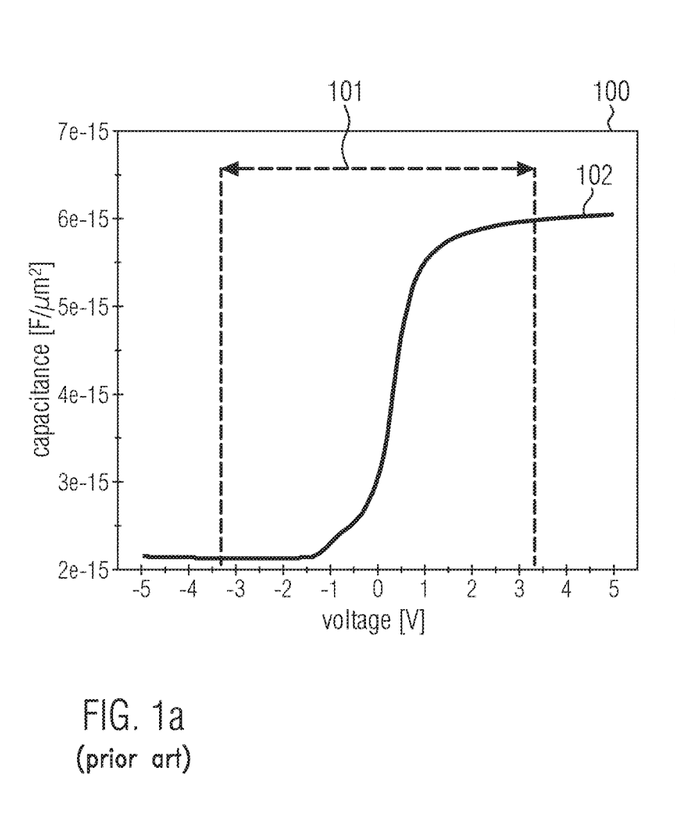
FIG. 1a schematically illustrates a graph showing the variation of the capacitance with respect to a capacitor voltage in a typical conventional capacitor formed in the device level of a semiconductor device.

FIG. 1a illustrates a graph 100 that depicts the progression of the capacitance of a typical capacitive structure based on conventional MOS techniques for a varying "gate" voltage, i.e., a voltage applied to capacitor electrode provided in the form of a "gate" electrode structure and to an electrode connected to the capacitor body having a "channel region" of transistor-like configuration with respect to the vertical doping profile. In FIG. 1a, a range 101 of voltages is shown, for which it is desired to have a substantially constant capacitance. On the other hand, curve 102 illustrates qualitatively the variation of the capacitance within the range 101. In the present example, a required width of the range 101 corresponds to −3.3-3.3 V. As is evident from FIG. 1a, the capacitance has a moderately high value at a voltage of 3.3 V and higher due to charge carrier accumulation in the "channel region" in the vicinity of the dielectric layer of a respective electrode structure. For zero voltage, however, a significant drop of the capacitance may be observed, which may result in a minimum capacitance at the voltage of −3.3 V and less, which in total may result in a drop of more than 50% across the desired voltage range 101. Since such a significant variation of the capacitance is considered inappropriate for applications requiring a substantially constant capacitance, alternative approaches have been applied.

To this end, frequently, capacitive structures may be implemented in the metallization system of a semiconductor device, which typically comprises a plurality of metallization layers including conductive lines, such as aluminum lines, copper lines and the like, which are separated by an appropriate dielectric material in each layer. Moreover, the individual layers of the plurality of stacked metallization layers are typically connected by so-called vias, which are also embedded in an appropriate dielectric material, thereby enabling a highly complex wiring system for connecting the circuit elements in the device level with contact pads, which may finally be used for connecting the semiconductor device with the periphery. Typically, capacitive structures provided in the metallization system have to be formed by inter-digitized metal lines for both capacitor electrodes, thereby requiring a specific connection regime between the individual electrode fingers and the plurality of metallization layers across which the respective capacitive structure is distributed. As a consequence, complex processing may be required and in particular a complex metallization system has to be provided in order to implement the capacitive structure that allows a voltage-independent operation of the capacitor and in particular offers the potential for using alternate polarity voltages. Moreover, positioning of respective capacitive structures that are formed in the metallization system is restricted to specific areas within the metallization system and thus reduces design flexibility. That is, typically, vertical offset and horizontal offset of the position of such capacitors is required with respect to a desired design position in the device level, which may unduly affect the overall efficiency of the capacitor. Moreover, the resulting density of capacitors is less than the capacitor density that is achievable by forming the capacitors as transistor-like elements in the device level of the semiconductor device.

In other approaches, metal-based capacitors have been implemented by using metal plates and high-k dielectric materials, even in a vertical configuration, thereby arriving at a very expensive and complicated process.

On the other hand, shifting the working point of a MOS-based capacitive structure so as to obtain a substantially flat behavior of the capacitance across the desired voltage range is not a desirable option, as will be discussed with reference to FIG. 1b.

Figure 1B:
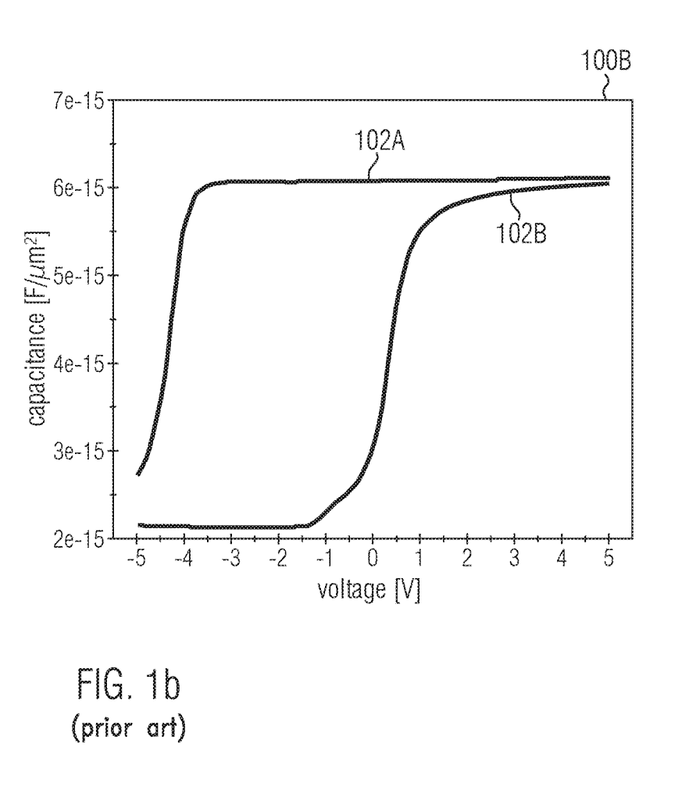
FIG. 1b illustrates a graph depicting the shift of the capacitance/voltage dependence upon applying an appropriate bias voltage for conventional capacitors.

FIG. 1b illustrates a graph 100B, in which curve 102B substantially corresponds to the curve 102 of FIG. 1a, while curve 102A represents the dependency of the capacitance on the voltage after biasing the structure. It appears that one would obtain the desired substantially flat capacitance/voltage behavior. However, applying such a regime to a MOS-based capacitive structure would lead to a biasing of the respective PN junction between a semiconductor region formed in accordance with the vertical transistor-like doping profile and the substrate, which is typically on ground potential. As a consequence, due to driving the respective PN junction into or near the conductive state renders this option less than desirable due to pronounced leakage. In addition, for semiconductor devices, which require an increased thickness of the respective gate dielectric layers and thus of the capacitor dielectric materials, a moderately high bias voltage in excess of ±5V may have to be taken into consideration upon designing the semiconductor device. Therefore, increased process complexity of the overall manufacturing process may contribute to higher production cost.

In view of the situation described above, the present disclosure, therefore, relates to techniques in which a capacitive structure may exhibit desired capacitance/voltage behavior with significantly reduced variation, thereby avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides capacitive structures and a method for manufacturing the same, wherein the capacitive structure may be implemented in the device level on the basis of a process technique that is also applied for forming other semiconductor-based circuit elements, such as transistors and the like. In illustrative embodiments, the transistors may be formed on the basis of CMOS technology, thereby obtaining transistors of different conductivity type, while also capacitive structures may be provided with a desired type of conductivity. In this manner, overall design flexibility may be increased and also a significant increase of overall capacitor density in a semiconductor device may be achieved. Moreover, the capacitive structures may have a significantly reduced degree of variability in capacitance versus applied voltage for a moderately wide range of operating voltages. To this end, it has been recognized by the inventors that a modified dopant profile in the semiconductor region positioned below the respective capacitor dielectric material may result in a significant improvement of the capacitor behavior. That is, it has been recognized that a highly doped semiconductor material at and in the vicinity of the capacitor dielectric material may result in a flattening of the respective capacitance/voltage behavior. The required dopant concentration and the lateral and vertical dimensions of a corresponding highly doped semiconductor region may be adjusted on the basis of well-established process techniques, thereby avoiding an increase in undue overall process complexity, while enabling the formation of capacitors with superior performance.

In one illustrative embodiment disclosed herein, a capacitive structure in a semiconductor device includes a first doped semiconductor region that comprises a first dopant species with a first concentration, wherein the first dopant species imparts a first type of conductivity to the first doped semiconductor region. The capacitive structure further includes a second doped semiconductor region formed below and in contact with the first doped semiconductor region, wherein the second doped semiconductor region comprises a second dopant species with a second concentration that is less than the first concentration. Moreover, the second dopant species imparts the first type of conductivity to the second doped semiconductor region. Moreover, the capacitive structure includes an electrode structure including a dielectric layer formed on the first doped semiconductor region. Additionally, the capacitive structure includes a contact structure formed so as to connect to the first doped semiconductor region.

According to a further illustrative embodiment disclosed herein, a capacitive structure in a semiconductor device includes a first doped semiconductor region having a specified type of conductivity that is imparted by a dopant species with a first concentration in the range of approximately $5 \times 10^{19}$ to $5 \times 10^{21}$ cm$^{-3}$. The capacitive structure further includes a second doped semiconductor region formed below and in contact with the first doped semiconductor region, wherein the second doped semiconductor region has the specified type of conductivity imparted by a second dopant species provided with a second concentration that is less than the first concentration. Additionally, the capacitive structure includes a dielectric layer formed on the first doped semiconductor region and an electrode structure that is formed on the dielectric layer. Moreover, the capacitive structure includes a contact structure formed so as to connect to the first doped semiconductor region.

According to a still further illustrative embodiment of the present disclosure, a method of forming a capacitive structure in a semiconductor device is provided. The method includes performing at least one of an implantation process and an in situ doping epitaxial growth process so as to form a first doped semiconductor region of a specified type of conductivity in a well region of the same type of conductivity such that the first doped semiconductor region has a higher dopant concentration compared to the well region. The method further includes forming an electrode structure on the first doped semiconductor region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless or otherwise indicated, all numbers expressing quantities, ratios and numerical properties of ingredients, reaction conditions and so forth used in the specification and claims are to be understood as being modified in all instances by the term "about."

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

According to the present disclosure, it has been recognized that a highly conductive semiconductor region formed below the capacitor dielectric material may result in superior capacitor performance, since, in this case, the influence of the capacitor voltage on the underlying semiconductor material is significantly less pronounced compared to conventional capacitors formed in the device level of, for instance, sophisticated CMOS devices. In illustrative embodiments of the present disclosure, therefore, appropriate process techniques may be applied so as to provide an appropriately doped semiconductor region specifically in the device areas, in which semiconductor-based capacitive structures, such as P-type capacitors and N-type capacitors, have to be formed. In illustrative embodiments, the characteristics of the respective semiconductor region, for instance in terms of dopant concentration and type of conductivity, lateral and in particular vertical dimension, and the like may be adjusted on the basis of epitaxial growth techniques, in which, for instance, a desired type of dopant species may be incorporated into the lattice of the semiconductor material with a highly controllable concentration, while also the vertical extension may be precisely controlled during the deposition process. To this end, suitable masking regimes may be applied at any appropriate manufacturing stage in order to perform the semiconductor regions for capacitive structures in desired device areas.

In other cases, the highly doped semiconductor regions for the capacitive structures may be formed on the basis of implantation techniques, in combination with appropriate masking strategies, thereby also enabling the formation of semiconductor regions of a desired dopant concentration, type of conductivity and sufficiently well-defined vertical extension.

On the basis of a corresponding highly doped semiconductor region formed immediately below and in contact with a corresponding capacitor dielectric material, without affecting the further processing of other circuit elements, such as MOS transistors and the like, capacitors of a desired conductivity type may be efficiently integrated into the process flow. In particular, a high degree of process flexibility in connecting to the highly doped semiconductor regions may be achieved by using contact structures or electrode structures according to any appropriate device configuration as may be required for transistors and the like to be provided in other device areas.

In the following it is also referred to the accompanying drawings, wherein it should be appreciated that any positional information or statements are to be understood as indicating the position or direction of a region or element with reference to a substrate material of a semiconductor device. In this sense, a "vertical" direction or "depth" direction is to be understood as a direction that is substantially orthogonal to a surface area, in and above which circuit elements, such as transistors and the like, are formed. More precisely, the depth direction is a vertical direction that points into the substrate and thus points to a substrate surface that is opposite to the surface area, in and on which semiconductor-based circuit elements are formed. Therefore, a first layer or region being positioned "below" or "under" a second region or layer is to be understood as a region or layer that is located closer to the second subset surface, i.e., the surface opposite to the active semiconductor material representing the surface area in and on which circuit elements are formed. Similarly, any terms having the meaning of "above," "over," "on" and the like are to be understood as indicating a positional relationship in the depth direction or a vertical direction, in which the distance with respect to the second substrate surface increases. In an analogous manner, terms such as "horizontal," "lateral" and the like are to be understood as indicating a direction or position that is substantially parallel with one of the substrate surfaces.

With reference to FIGS. 2a-6, further illustrative embodiments will now be described in more detail.

Figure 2A:
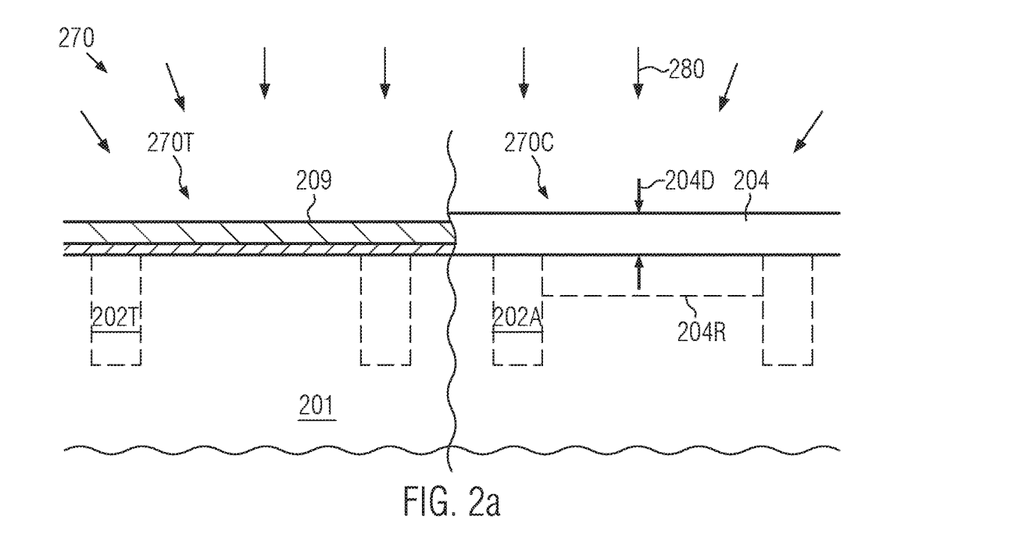
FIGS. 2a and 2b schematically illustrate cross-sectional views of a semiconductor device in an early manufacturing stage during the formation of a highly doped semiconductor region for a capacitive structure, according to illustrative embodiments of the present disclosure.

FIG. 2a schematically illustrates a cross-sectional view of a semiconductor device 270, which may represent a semiconductor device in which semiconductor-based circuit elements, such as transistors and the like, may have to be provided in certain device areas 270T, while, in at least some other device areas 270C, capacitive structures may have to be provided in conformity with the overall design rules of the semiconductor device 270. The semiconductor device 270 may comprise a substrate layer 201, which may represent any appropriate semiconductor material, such as silicon, silicon/germanium, silicon/carbon and the like, in order to provide an appropriate base material for forming therein and thereon respective circuit elements. In some illustrative embodiments, the substrate layer 201 may represent a semiconductor material that is formed on a buried insulating layer (not shown), thereby forming an SOI (semiconductor- or silicon-on-insulator) architecture, at least in some areas of the semiconductor device 270. In other cases, the substrate layer 201 may represent the bulk material of a corresponding semiconductor substrate, thereby providing a bulk configuration. For example, P-doped semiconductor substrates, i.e., semiconductor substrates including an appropriate dopant species so as to impart a P-type conductivity to the semiconductor material, may frequently be used in volume production of sophisticated semiconductor devices.

In some illustrative embodiments, isolation structures 202T, 202A may be formed in the device area 270T and 270C, respectively, wherein the isolation structures may be provided in the form of shallow trench isolations and the like. In other illustrative embodiments, isolation structures may not yet be provided in this manufacturing stage.

Moreover, a growth mask 209, such as a dielectric material in the form of silicon dioxide, silicon nitride or a combination thereof, may be provided so as to cover the semiconductor material in the device area 270T, while exposing the semiconductor material in the device area 270C. Moreover, an epitaxially grown highly doped semiconductor region 204 may be formed on the base semiconductor material of the layer 201 so as to have a desired type of dopant species incorporated therein in order to impart a desired type of conductivity to the semiconductor region 204 as required for forming a corresponding P-type capacitive structure or N-type capacitive structure, depending on the overall device requirements.

The semiconductor device 270 as illustrated in FIG. 2a may be formed on the basis of the following processes. The substrate layer 201 may be processed in accordance with process strategies, for instance for forming the isolation structures 202T, 202A according to embodiments in which the semiconductor region 204 is to be formed on the basis of a configuration including the isolation structures 202T, 202A. To this end, any well-established strategies for forming trenches, filling the trenches with an appropriate dielectric material, and subsequently planarizing the resulting surface topography may be applied. Thereafter, the growth mask 209 may be formed by deposition and/or oxidation and selective removal of the one or more materials of the growth mask 209 from above the device area 270C may be performed. To this end, well-established lithography techniques and etch recipes may be applied. Thereafter, the exposed surface in the device area 270C may be appropriately prepared for a subsequent epitaxial growth process 280, during which the in situ doped semiconductor region 204 may be formed. It should be appreciated that, in particular in embodiments in which the isolation structures 202A, 202T may have been formed in an earlier phase, a respective recess 204R may be formed on the basis of appropriate etch techniques in order to selectively grow the semiconductor region 204 in the previously formed recess 204R.

Irrespective of the overall process strategy, i.e., forming the semiconductor region 204 prior to or after manufacturing the isolation structures 202T, 202A, during the growth process 280, a desired dopant species may be incorporated into the deposition atmosphere so as to incorporate the dopant species with a desired concentration, while, based on the deposition time, a thickness 204D of the semiconductor region 204 may be controlled. In illustrative embodiments, the semiconductor region 204 may be provided as a semiconductor region having an N-type conductivity, for instance obtained by incorporating phosphorus as a dopant species during the growth process 280 so as to obtain a concentration of the dopant species within the semiconductor region 204 in a range of $5 \times 10^{19}$-$5 \times 10^{21}$ atoms per cubic centimeter ($cm^{-3}$). In other cases, boron or a boron-containing precursor material may be added to the deposition atmosphere of the process 280 so as to impart a P-type conductivity to the semiconductor region 204. Also in this case, the concentration of the P-type dopant species may be within the previously specified range. Moreover, in illustrative embodiments, the growth process 280 may be controlled so as to adjust a thickness 204D such that, after completing the overall processing of the device 270, a layer thickness of 2-20 nanometer (nm) may be obtained. That is, the overall material loss during the further processing, if any, may be taken into consideration upon controlling the process 280 so as to finally obtain the thickness 204D within the above-specified range. As a consequence, the characteristics of the semiconductor region 204 may be adjusted in a highly precise and reproducible manner, thereby also contributing to a low degree of device variability upon completing a capacitive structure in the device area 270C on the basis of the semiconductor region 204.

It should be appreciated that, prior to or after forming the semiconductor region 204, any other process steps, such as implanting a dopant species for well regions and the like, may be performed, which, for convenience, are not illustrated in FIG. 2a. In particular, the process for forming the isolation structures 202T, 202A may be performed after providing the semiconductor region 204.

Another alternative is the semiconductor region 204 may be formed as a semiconductor layer that may be formed over a large area of the semiconductor device 270 or above the entire surface and afterwards be selectively removed from the device area 270T. To this end, a respective etch mask, for instance in the form of a resist mask, a hard mask and the like, may be formed so as to cover the material 204 above the device area 207C and to expose the material above the area 270T. Thereafter, any appropriate removal process, possibly including etching, oxidation and etching, or the like, may be applied so as to remove any exposed portions of the semiconductor material 204.

Figure 2B:
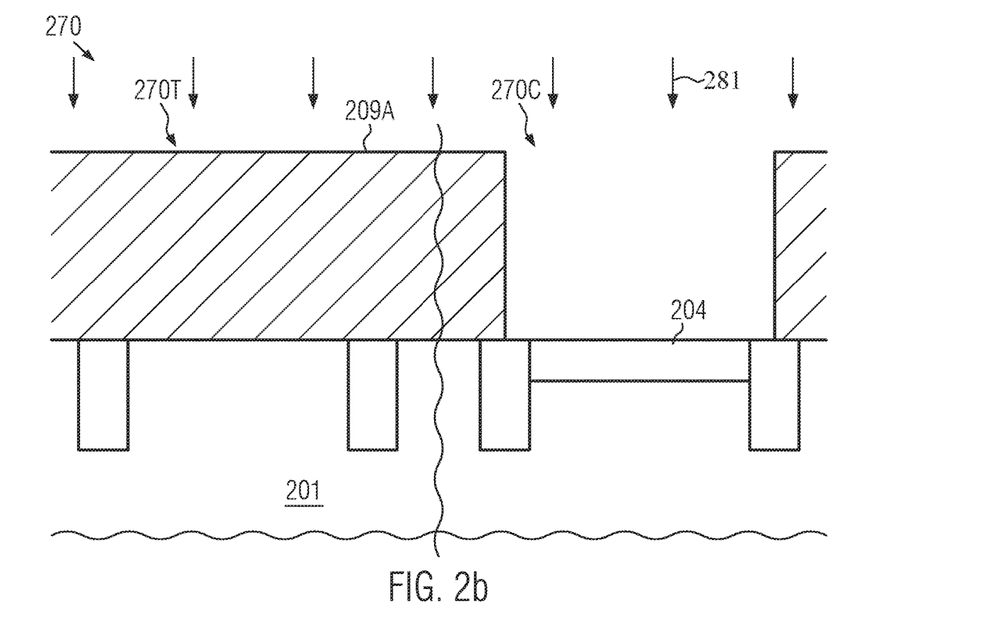

FIG. 2b schematically illustrates the semiconductor device 270 according to further illustrative embodiments, in which the semiconductor region 204 may be formed on the basis of an implantation process 281. To this end, at any appropriate manufacturing stage, an implantation mask 209A may be formed so as to expose those device portions in which the semiconductor region 204 is to be formed. To this end, well-established lithography techniques may be applied. It should further be appreciated that, although FIG. 2b illustrates the implantation process 281 to be carried out in a manufacturing stage in which the isolation structures 202T, 202A may be present, in other illustrative embodiments, the implantation process 281 may be performed at an earlier manufacturing stage, depending on the overall process strategy. It should further be appreciated that the implantation process 281 is to be understood as a process sequence in which a plurality of individual implantation steps may be performed so as to obtain the desired result. In particular, the process 281 is to include any implantation processes required for providing the semiconductor region 204 with different conductivity types in different device areas, for instance for providing P-type capacitive structures and N-type capacitive structures within a single semiconductor device. In other cases, only one type of capacitive structures may be provided, if such a configuration is compatible with the overall device requirements.

Similarly, the process of providing the implantation mask 209A is to be understood as including any process sequence required for performing the various implantation steps, for instance, when providing the semiconductor region 204 with different conductivity types. In some illustrative embodiments, an N-type dopant species may be incorporated during the process 281, such as arsenic, phosphorus, on the basis of an implantation energy of 2-7 keV at a dose of $5 \times 10^{14}$-$5 \times 10^{15}$ ions/per square centimeter ($cm^{-2}$). In other illustrative embodiments, in which a P-type conductivity is to be imparted to the semiconductor region 204, a P-type dopant species may be used for the implantation, such as BF2, on the basis of an implantation energy of 2-6 keV with a dose of $5 \times 10^{14}$-$4 \times 10^{15}$ ions/$cm^{-2}$. On the basis of these implantation parameters, a dopant concentration may be obtained, as specified above, while also the thickness of the semiconductor region 204 may be obtained in the above-defined range. In this case, it should be appreciated that the implantation parameters are selected in the context of the overall thermal budget for the further processing of the device so that, after any anneal processes and any optional material loss during the further processing, a thickness of 2-20 nm may be obtained. In this respect, it should be appreciated that, due to the nature of the implantation process 281, the boundary between two adjacent doped regions may not be exactly determined and may have instead a substantially continuous transition region. In the context of the present application, it is to be understood that the dimensions of the semiconductor region 204 may be determined by taking those regions as boundary regions, in which the concentration corresponds to the lower limit of the above-specified concentration range, i.e., a continuous doped region may be considered as representing the region 204, in which the dopant concentration is consistently within the above-identified upper and lower limits. That is, any adjacent doped region having a dopant concentration above the upper limit of the concentration range, as well as any adjacent doped region having a dopant concentration below the lower limit, may be considered as a region outside of the semiconductor region 204. The above considerations apply to dopant species of the same conductivity type, whereas adjacent semiconductor regions having different conductivity types may be separated by a PN junction and may, therefore, be considered as being separated by the corresponding PN junction.

Figure 2C:
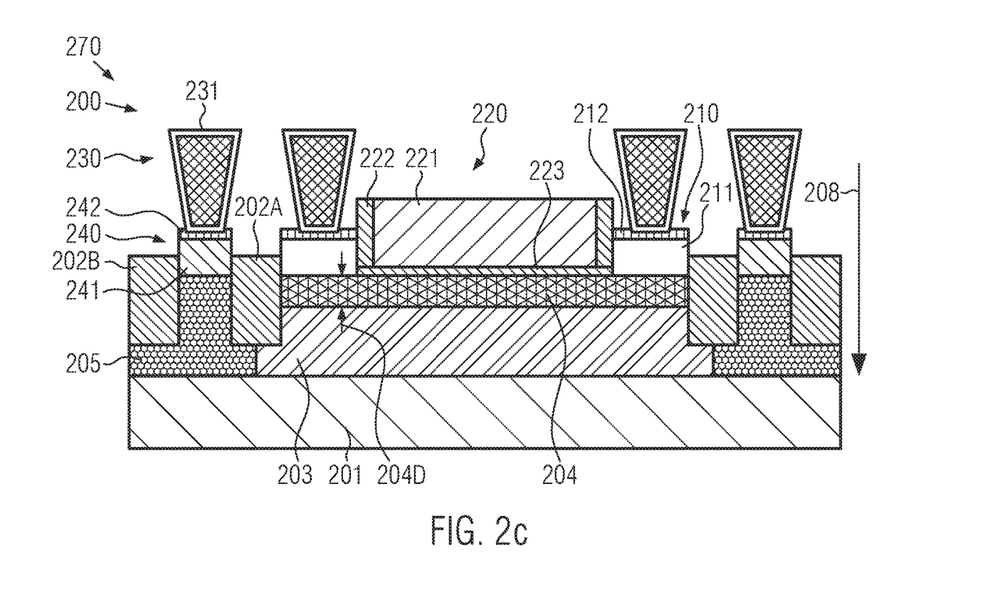
FIG. 2c schematically illustrates a cross-sectional view of the semiconductor device in a very advanced manufacturing stage, wherein a capacitive structure may be formed on the basis of a highly doped "channel region," which is contacted by a raised electrode region, according to illustrative embodiments.

FIG. 2c schematically illustrates a cross-sectional view of the semiconductor device 270 in an advanced manufacturing stage. For convenience, a capacitive structure 200 formed above the device area 270C (FIGS. 2a, 2b) is illustrated. As shown, the capacitive structure 200 may comprise the substrate layer 201 and the semiconductor region 204 having the characteristics as specified above with reference to FIGS. 2a and 2b. Moreover, the semiconductor region 204 may be formed above a doped semiconductor region 203, which may have the same type of conductivity as the region 204. In the embodiment shown, the semiconductor regions 204, 203 may have an N-type conductivity, wherein respective dopant species in the regions 204, 203 may be provided with a concentration such that the net concentration of N-type dopant species in the region 204 is in the above-identified range, while the net concentration of an N-type dopant species in the region 203 is less than in the region 204.

Moreover, the capacitive structure 200 may comprise contact structures 210, which, in the embodiment shown, may be provided with an electrode region 211 formed of a highly doped semiconductor material having the same conductivity type as the regions 204 and 203. For example, the electrode regions 211 may have substantially the same configuration as a drain and source region of a certain type of N-transistors, except for the lateral dimensions, which may be selected so as to comply with the requirements for the capacitive structure 200. In the embodiment shown, the electrode region 211 represents a "raised" configuration, since the top surface of the electrode region 211 extends above an interface formed by a dielectric layer 223 of an electrode structure 220 and the semiconductor region 204. For example, the raised electrode region 211 extends 10-30 nm above the interface formed by the dielectric layer 223 and the semiconductor region 204. Typically, the concentration of dopant species in the electrode region 211 may be higher, as the concentration in the semiconductor region 203 and, in some illustrative embodiments, the concentration of the electrode region 211 may be equal to or higher than the concentration in the semiconductor region 204.

The electrode structure 220, which may represent one "capacitor plate" of the capacitive structure 200, may have substantially the same configuration as respective gate electrode structures of a certain type of transistors formed in the semiconductor device 270, except for the lateral dimensions, which are selected so as to meet the requirements of the capacitive structure 200. For example, the electrode structure 220 may comprise an electrode material 221, such as a doped polysilicon, doped amorphous silicon, doped silicon/germanium, metal-containing materials, or any combination thereof, depending on the gate electrode structure of the respective transistors to be formed in combination with the capacitive structure 200. Furthermore, an appropriate spacer structure 222 may be formed on sidewalls of the electrode material 221. Similarly, the dielectric material 223 may represent the gate dielectric material of a specific type of transistors in other device areas and may therefore have a respective composition and thickness in accordance with the requirements for the respective transistor type. Consequently, the dielectric layer 223 may be formed of silicon dioxide, silicon nitride, silicon oxynitride, metal-containing dielectric materials, high-k dielectric materials, and any combination thereof. In some illustrative embodiments, the dielectric layer 223 may have a thickness, i.e., the dimension along the depth direction 208, of 2-7 nm, which may correspond to the thickness of gate electrodes of transistors requiring a moderately "thick" gate "oxide."

Moreover, a further doped semiconductor region 205 may be formed laterally adjacent to the semiconductor region 203 and may be contacted with the use of a contact structure 240, which may also comprise a highly doped electrode region 241. The electrode region 241 and the further doped region 205 laterally adjacent to the region 203 may have inverse conductivity type compared to the regions 203, 204. Consequently, for a P-type substrate layer 201, the contact structure 240 may provide electric contact to the substrate material 201 in order to apply a desired potential, for instance ground potential, during operation of the device 270. Furthermore, as illustrated, the contact structure 240 may be laterally isolated by the isolation structure 202A and an isolation structure 202B. Moreover, as illustrated, the contact structures 210 and 240 may have formed on the respective top surfaces thereof a metal-containing material layer 242, 212, respectively, which may be provided in the form of nickel silicide and the like. The metal-containing layers 242, 212 represent the respective contact interfaces for connecting to a contact level 230 of the device 270, in which respective contact elements 231 may be formed in one or more interlayer dielectric materials (not shown), thereby providing a connection to a metallization system (not shown) of the device 270.

The semiconductor device 270 as illustrated in FIG. 2c may be formed on the basis of the following processes. Prior to or after forming the semiconductor region 204, in the present embodiment in the form of a region having N-type conductivity and exhibiting the above-specified characteristics with respect to dopant concentration and vertical extension, the regions 203, 205 may be formed, for instance, by applying well-established well implantation techniques, thereby also forming the P-wells and N-wells of P-type and N-type transistors. It should be appreciated that, upon forming the semiconductor region 203 having the same conductivity type as the region 204, any possibly additionally added dopant species may be taken into account upon initially forming the region 204 so as to arrive at the desired total concentration within the range specified above in the context of FIGS. 2a, 2b. That is, in embodiments in which the well region 203 may be formed by ion implantation after having formed the semiconductor region 204, for instance by epitaxial growth or implantation, the process parameters may be controlled such that any additionally introduced dopant species may not result in a shift of dopant concentration that is beyond the above-specified range. It should be appreciated, however, that typically the reduced dopant concentration required in the well region 203 may not result in a significant shift of the dopant concentration at all, even if the region 204 is already in place upon implanting the dopant species for the region 203.

After any anneal processes, the gate electrode structure 220 may be formed on the basis of process techniques that are compatible with the formation of respective gate electrode structures of transistor elements. For example, the gate dielectric layer 223 may be formed by deposition and/or oxidation, depending on the desired configuration, followed by the deposition of one or more appropriate electrode materials 221, which may subsequently be patterned by using well-established patterning strategies, including sophisticated lithography and etch techniques. Thereafter, the spacer structure 222 may be formed, followed by electrode regions 211, which may be formed together with raised drain and source regions of respective N-type transistors, while the electrode regions 241 may be formed together with raised drain and source regions of P-transistors. It should be appreciated, however, that not necessarily both types of contact structures 210, 240 may have a raised electrode configuration, if, for instance, one type of transistors may not be provided with a raised drain and source configuration. The raised electrode regions 211, 241 may be formed on the basis of epitaxial growth techniques, wherein an appropriate dopant species imparting, in the embodiment shown, N-conductivity to the electrode region 211 and P-type conductivity to the electrode region 241, is introduced in the respective deposition atmospheres. Consequently, the highly doped electrode regions 211 may be formed with well-controlled dopant concentration and vertical extension. Thereafter, the contact level 230 may be formed by depositing one or more interlayer dielectric materials and patterning the same so as to form respective contact openings, which may subsequently be filled with appropriate conductive materials, such as metal-containing materials, and the like, thereby forming the contact elements 231 connecting to the respective metal-containing layers 212, 242, which have been formed prior to depositing the one or more interlayer dielectric materials, or which may be locally formed after forming the respective contact openings.

It should be appreciated that instead of providing the capacitive structure 200 in the form of an N-type capacitor by providing the doped regions 203, 204 in the form of semiconductor materials having N-type conductivity, a P-type capacitor may be formed by inverting the conductivity type of any of the semiconductor materials and of the substrate layer 201. That is, by providing an N-type substrate layer and P-doped semiconductor materials for the regions 203, 204 and the electrode regions 211 and by providing an N-type dopant species for the regions 205 and 241, a corresponding P-type capacitor may be obtained. Also in this case, the respective criteria put forward above with respect to concentration of the various semiconductor materials and the vertical extension thereof may apply in the same manner.

Figure 3:
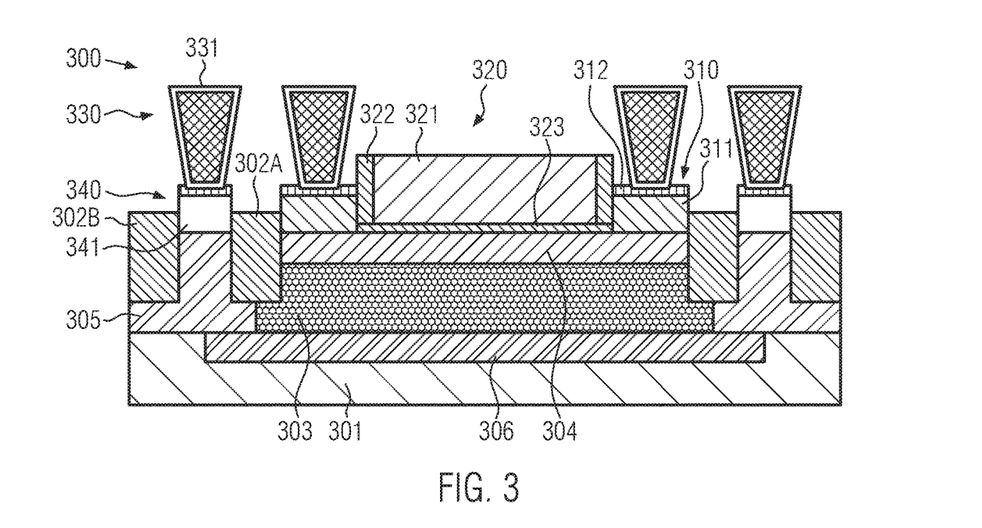
FIG. 3 schematically illustrates a cross-sectional view of a capacitive structure having a similar configuration as the capacitive structure shown in FIG. 2c except for an inverse conductivity type according to illustrative embodiments.

FIG. 3 schematically illustrates a cross-sectional view of a capacitive structure 300 provided in the form of a P-type capacitor. In the embodiment shown, the capacitive structure 300 may be formed on the basis of a substrate layer 301 having P-type conductivity in the same manner as the substrate layer 201 of the capacitive structure 200 in FIG. 2c. On the other hand, a semiconductor region 304 formed below a gate electrode structure 320 may have P-type conductivity as well as a semiconductor region 303 formed below the semiconductor region 304. Similarly, a semiconductor region 305 located laterally adjacent to the region 303 may have N-type conductivity as well as the respective electrode region 341 of a contact structure 340 that connects to the region 305. Similarly, a contact structure 310 may comprise a highly doped electrode region 311 having P-type conductivity so as to connect to the semiconductor region 304. Moreover, a doped isolation region 306 formed of a doped semiconductor material having inverse conductivity type with respect to the semiconductor region 303 may be provided so as to electrically isolate the region 303 from the substrate layer 301. Consequently, the isolation region 306 may be contacted by the contact structure 340, which has the same type of conductivity as the isolation region 306.

It should be appreciated that basically the components shown in FIG. 3 may correspond to the respective structure elements shown and explained with reference to FIG. 2c. Hence, these components are designated by the same reference numbers except for the first digit, which is a "3" instead of a "2." Therefore, a respective discussion of these components and their manufacturing will be omitted here. It should be appreciated, however, that at least one of the contact structures 310, 340 may also have a raised configuration, as explained before. The capacitive structures 200, 300 may readily be formed on the same semiconductor device, for instance, when forming P-type transistors and N-type transistors having raised drain and source configurations.

Figure 4:
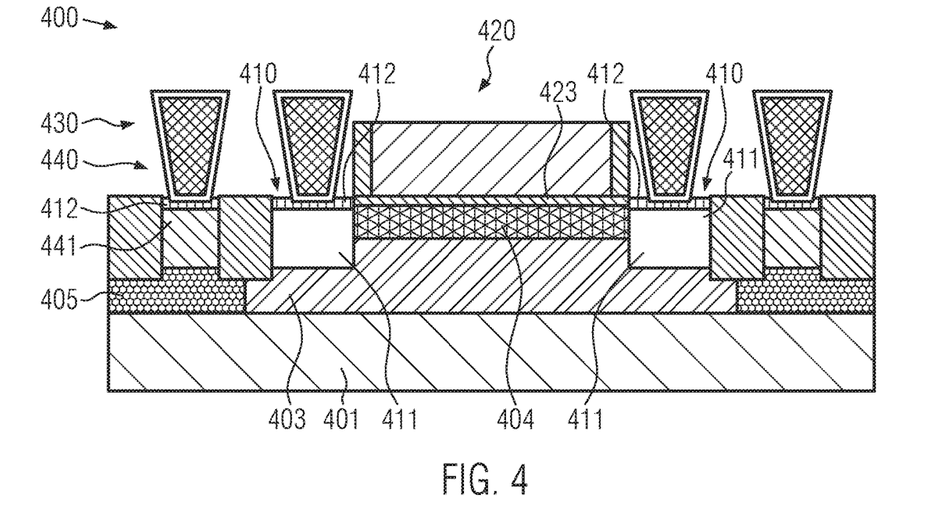
FIG. 4 schematically illustrates a cross-sectional view of a capacitive structure having a similar configuration compared to the capacitive structures illustrated in FIGS. 2c and 3 except for an electrode region, which may be formed on the basis of a substantially planar electrode configuration, according to illustrative embodiments.

FIG. 4 schematically illustrates a cross-sectional view of a capacitive structure 400 according to further illustrative embodiments. In this case, a P-type capacitor is illustrated, which may be formed on the basis of a P-type subset layer 401 and semiconductor regions 404, 403 having N-type conductivity. Moreover, respective contact structures 410 connecting to the regions 403 and 404 may be provided, wherein an electrode region 411 may represent a highly doped semiconductor material that does not substantially extend above an interface formed between a dielectric layer 423 and the semiconductor region 404. Similarly, a contact structure 440 connecting to a well region 405 of inverse conductivity type with respect to the regions 403, 404 may include a highly doped electrode region 411 that does not substantially extend above the gate dielectric layer 423. With respect to any further components shown in FIG. 4, it is to be understood that these components may have the same configuration as previously explained in the context of FIGS. 2c and 3 and, thus, a respective discussion of these components may be omitted. It should be appreciated, however, that the electrode regions 411, 441 may be provided in the form of highly doped semiconductor materials corresponding to the drain and source regions of transistors, which may have been formed by ion implantation without using a raised drain and source architecture.

In other illustrative embodiments, a P-type capacitor may be provided by inverting the type of conductivity of any of the doped semiconductor materials, as is already discussed above with reference to FIG. 2c, while, in other cases, a P-type capacitor may be obtained by inverting the conductivity type of any doped semiconductor material, except for the substrate layer 401, which may still represent a P-type semiconductor material. In this case, an isolation region, such as the region 306 (FIG. 3), may be formed below the semiconductor region 403 with appropriate lateral extension as shown in FIG. 3, thereby providing electrical isolation to the P-type substrate layer 401.

Figure 5:
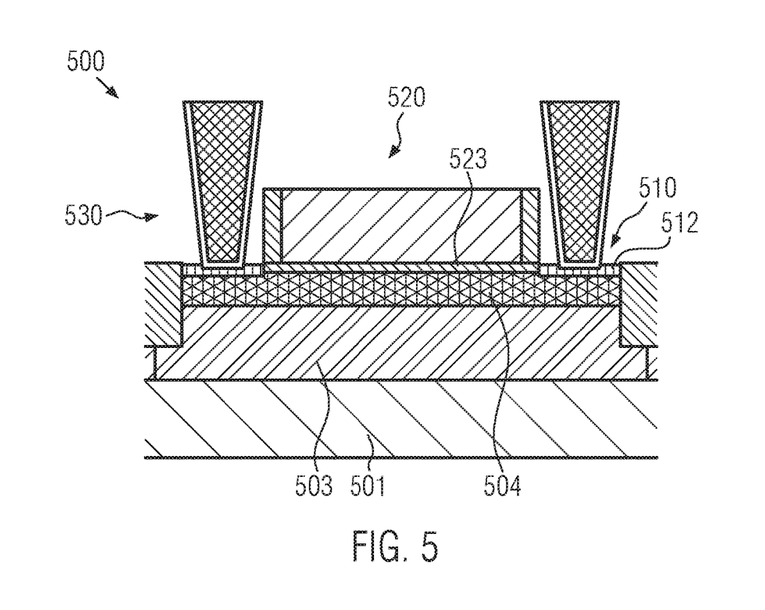
FIG. 5 schematically illustrates a cross-sectional view of a capacitive structure including a highly doped semiconductor region, which may be directly connected to a contact level of the semiconductor device by providing a metal-containing region directly in and on a portion of the highly doped semiconductor region, according to still further illustrative embodiments.

FIG. 5 schematically illustrates a cross-sectional view of a further capacitive structure 500, which may comprise a semiconductor region 504 and a vertically adjacent semiconductor region 503, which may represent semiconductor regions of N-type conductivity so as to provide, in combination with a P-type substrate layer 501, an N-type capacitive structure. Furthermore, a contact structure 510 connecting to the semiconductor region 504 may be provided in the form of a metal-containing material layer 512, which may be directly formed on a portion of the semiconductor region 504. That is, in this case, any intermediate electrode regions, which may correspond to drain and source regions of transistors provided in other device areas, may not be present. Due to the relatively high dopant concentration of the semiconductor region 504, the metal-containing layer 512 may be readily formed directly on the semiconductor material of the region 504 by using a manufacturing process for obtaining respective metal-containing layers in drain and source regions of transistor elements, substantially without requiring a modification of the respective formation processes.

It should be appreciated that also in this case a P-type capacitor may be obtained by inverting any of the conductivity types and using an N-type substrate layer 501, or by adding an isolation region, such as the region 306 (FIG. 3), when the P-type substrate layer 501 is to be maintained, and by inverting the conductivity type of any other doped semiconductor material.

It should further be appreciated that any of the semiconductor regions 204, 304, 404, 504 may be formed on the basis of process techniques, as previously discussed with reference to FIGS. 2*a* and 2*b*. That is, any of these semiconductor regions may be formed by epitaxial growth techniques and/or implantation processes, thereby adjusting the desired conductivity type, concentration and vertical extension of these regions in accordance with the criteria as previously discussed.

Figure 6:
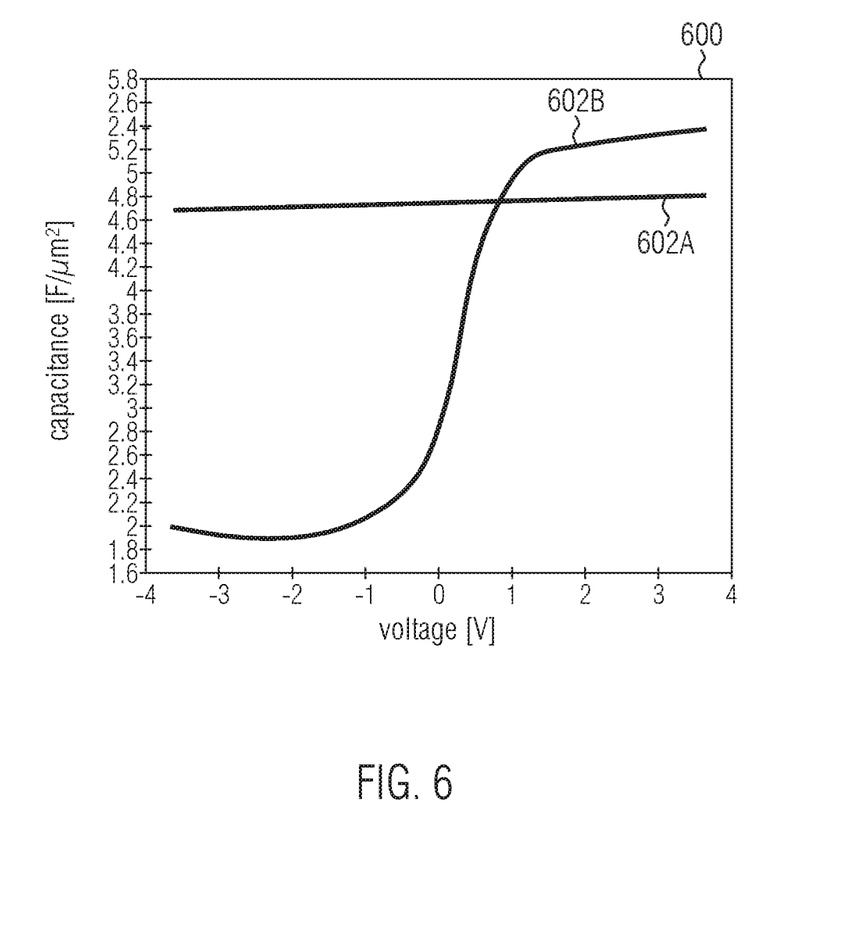
FIG. 6 schematically illustrates a graph that shows measurement results of a capacitive structure in comparison to a conventional capacitor.

FIG. 6 schematically illustrates measurement results obtained by capacitive structures formed and configured in a manner as discussed above with reference to FIGS. 2*a*, 2*be*, 2*c* and 3-5 in comparison to a conventional sample that may be formed on the basis of strategies in which the vertical dopant profile in a capacitor resembles the vertical dopant profile of conventional well regions and channel regions of respective transistors. For example, the horizontal axis represents the voltage applied to the capacitive structure, for instance, a voltage applied to the respective electrode structures 220, 320, 420, 520 and the corresponding semiconductor regions 204, 304, 404, 504. For the specific sample formed in accordance with a conventional configuration, a pronounced variability of the capacitance versus the applied capacitor voltage is observed, as shown by curve 602*b* and as is also discussed with reference to FIGS. 1*a* and 1*b*. On the other hand, the variability of capacitors manufactured in accordance with the present disclosure, as represented by curve 602A, is significantly reduced and within a voltage range of ±3.6 V, the observed variability is 3% or less, wherein this variability is defined by the ratio of the minimum capacitance and the maximum capacitance within the specified voltage range. In other illustrative embodiments, a respective reduced variability may be obtained for a voltage range of ±5 V.

As a result, the present disclosure provides capacitive structures and manufacturing techniques for forming these structures, wherein a highly conductive semiconductor region may be formed below the capacitor dielectric material and may be in contact therewith, wherein an appropriate dopant concentration and a vertical extension of this highly doped semiconductor region may provide the desired flatness of the capacitance/voltage relation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A capacitive structure in a semiconductor device, comprising:
    a first doped semiconductor region comprising a first dopant species with a first concentration, said first dopant species imparting a first type of conductivity to said first doped semiconductor region;
    a second doped semiconductor region formed below and in contact with said first doped semiconductor region, said second doped semiconductor region comprising a second dopant species with a second concentration that is less than said first concentration, said second dopant species imparting said first type of conductivity to said second doped semiconductor region;
    an electrode structure including a dielectric layer formed on said first doped semiconductor region;
    a first contact structure formed so as to connect to said first doped semiconductor region;
    a second contact structure formed so as to connect to said second doped semiconductor region; and
    an isolation structure disposed between said second contact structure and said first doped semiconductor region.

2. The capacitive structure of claim 1, wherein an extension of said first doped semiconductor region in a depth direction is in a range of approximately 2-20 nm.

3. The capacitive structure of claim 1, wherein said first concentration is in a range of approximately $5 \times 10^{19}$ to $5 \times 10^{21}$ ions/cm$^{-3}$.

4. The capacitive structure of claim 1, wherein said first contact structure comprises a third doped semiconductor region including a third dopant species with a third concentration that is greater than said second concentration that imparts said first conductivity type to said third doped semiconductor region, and wherein said third doped semiconductor region is formed laterally adjacent to said dielectric layer and extends above an upper surface of said dielectric layer.

5. The capacitive structure of claim 4, wherein said first contact structure comprises a metal-containing layer formed on said third doped semiconductor region.

6. The capacitive structure of claim 1, wherein said first contact structure comprises a doped electrode region including an electrode dopant species with a fourth concentration greater than said second concentration that imparts said first conductivity type to said doped electrode region, and wherein said doped electrode region is formed laterally adjacent to said dielectric layer and extends into said second semiconductor region.

7. The capacitive structure of claim 6, wherein said first contact structure comprises a metal-containing layer formed on said doped electrode region.

8. The capacitive structure of claim 1, wherein said first contact structure comprises a metal-containing layer directly formed on a portion of said first doped semiconductor region.

9. The capacitive structure of claim 1, further comprising a substrate layer formed below said second doped semiconductor region and comprising a substrate dopant species with a substrate concentration that imparts a second type of conductivity to said substrate layer, wherein said second type of conductivity is inverse to said first type of conductivity and wherein said substrate concentration is less than said second concentration.

10. The capacitive structure of claim 1, further comprising a substrate layer formed below said second doped semiconductor region and comprising a substrate dopant species with a substrate concentration that imparts said first type of conductivity to said substrate layer, and further comprising a doped isolation region directly contacting said substrate layer and directly contacting said second doped semiconductor layer so as to isolate said substrate layer from said second doped semiconductor, wherein said doped isolation region comprises a dopant species that imparts a second type of conductivity to said doped isolation region.

11. The capacitive structure of claim 1, wherein a thickness of said dielectric layer is in a range of approximately 2-7 nm.

12. The capacitive structure of claim 9, further comprising a second contact structure that connects to said substrate layer.

13. The capacitive structure of claim 10, further comprising a third contact structure that connects to said doped isolation region.

14. A capacitive structure in a semiconductor device, comprising:
- a first doped semiconductor region having a specified type of conductivity imparted by a dopant species provided with a first concentration;
- a second doped semiconductor region formed below and in contact with said first doped semiconductor region, said second doped semiconductor region having said specified type of conductivity imparted by a second dopant species provided with a second concentration that is less than said first concentration;
- a dielectric layer formed on said first doped semiconductor region;
- an electrode structure formed on said dielectric layer; and
- a contact structure formed so as to connect to said first doped semiconductor region, wherein said contact structure comprises a metal-containing layer directly formed in a portion of said first doped semiconductor region and an intermediate doped electrode region.

15. The capacitive structure of claim 14, wherein an extension of said first doped semiconductor region in a depth direction is in a range of approximately 2-20 nm.

16. The capacitive structure of claim 14, wherein said contact structure comprises a metal-containing layer in an intermediate doped electrode region that is in contact with said first doped semiconductor region.

17. A method of forming a capacitive structure in a semiconductor device, the method comprising:
- performing at least one of an implantation process and an in situ doping epitaxial growth process so as to form a first doped semiconductor region of a specified type of conductivity in a second doped semiconductor region of the same type of conductivity such that said first doped semiconductor region has a higher dopant concentration compared to said second doped semiconductor region;
- forming an electrode structure including a dielectric layer formed on said first doped semiconductor region;
- forming a first contact structure formed so as to connect to said first doped semiconductor region;
- forming a second contact structure formed so as to connect to said second doped semiconductor region; and
- forming an isolation structure disposed between said second contact structure and said first doped semiconductor region.

18. The method of claim 17, wherein forming said first contact structure so as to connect to said first doped semiconductor region comprises forming a metal-containing layer on an intermediate electrode region.

19. The method of claim 17, wherein forming said first contact structure so as to connect to said first doped semiconductor region comprises forming a metal-containing layer directly on a portion of said first doped semiconductor region.

* * * * *